United States Patent [19]

Token

[11] 4,330,812
[45] May 18, 1982

[54] CIRCUIT BOARD ELECTRONIC COMPONENT COOLING STRUCTURE WITH COMPOSITE SPACER

[75] Inventor: Kenneth H. Token, St. Charles, Mo.

[73] Assignee: The United States of America as represented by the Secretary of the Navy, Washington, D.C.

[21] Appl. No.: 175,118

[22] Filed: Aug. 4, 1980

[51] Int. Cl.³ .............................................. H05K 7/20
[52] U.S. Cl. .................................. 361/386; 361/387; 361/399; 361/385
[58] Field of Search ............... 361/381, 382, 385, 386, 361/387, 388, 389, 415, 417, 419, 420, 395, 399, 412; 357/79, 81, 82; 165/80, 105; 174/15 HP, 16 HS

[56] References Cited

U.S. PATENT DOCUMENTS

| | | | |
|---|---|---|---|
| 3,550,681 | 12/1970 | Stier | 165/80 E |
| 3,631,325 | 12/1971 | Wenz | 361/415 |
| 3,678,342 | 7/1972 | Shaw | 361/386 |
| 3,735,206 | 5/1973 | Pesek | 361/386 |
| 3,836,704 | 9/1974 | Coules | 361/412 |
| 3,845,359 | 10/1974 | Fedele | 361/415 |
| 4,092,697 | 5/1978 | Spaight | 361/386 |
| 4,118,756 | 10/1978 | Nelson | 361/385 |
| 4,138,692 | 2/1979 | Meeker | 357/82 |

Primary Examiner—Gerald P. Tolin
Attorney, Agent, or Firm—Richard S. Sciascia; Harvey A. David

[57] ABSTRACT

Cooling of electronic components on a circuit board is accomplished by a thermally conductive element such as a heat pipe that is in spaced parallel relation to the board and in contact with the upper surfaces of the components. The ends of the conductive element are forced into contact with a heat receiving and dissipating frame by a clamp device acting through the board and a lightweight spacer between the board and the conductive element.

5 Claims, 3 Drawing Figures

CIRCUIT BOARD ELECTRONIC COMPONENT COOLING STRUCTURE WITH COMPOSITE SPACER

BACKGROUND OF THE INVENTION

This invention relates generally to the removal of heat from electronic circuit components, and more particularly an improved construction for conducting heat from components, mounted on a common panel or board, to a panel support structure.

Electronic component generated heat may be transferred from the component to its surroundings by convection, radiation, or conduction. Heat may be transferred directly from the component by convection where any of its surfaces are exposed to a surrounding fluid, either liquid or gas. However, direct contact of the cooling fluid with the component may contaminate the component and influence its electronic functions or inhibit maintenance procedures. U.S. Pat. No. 4,138,692 avoids the contamination aspect by placing a heat conducting stud in direct contact with the component, with the stud extending through a bellows into the cooling fluid. The resulting construction is cumbersome and not well suited to edge mounted circuit panels in a stacking arrangement.

Heat may be transferred directly from a component by radiation from any of its surfaces to cooler surrounding surfaces. However, the low component operating temperatures required for high reliability of electronic operation causes heat radiation to be small.

Heat may be conducted directly from a component through its electrical leads or connectors, e.g., the component can be mounted astride the heat transfer material or heat transfer device. An example of this is provided by U.S. Pat. No. 4,118,756 wherein a heat pipe device having conduction bars extending between the electronic components and the supporting circuit panel. The specific design of the conducting bars must be coordinated with the electronic design to insure that the heat conduction paths do not interfere with electrical circuits, hence each electronic module, or component becomes a unique design problem. An additional shortcoming in that arrangement has been identified as an increase in shock and vibration sensitivity because of the increased lead lengths necessary to span the heat pipe bars and subject to the mass of the component.

Still another shortcoming or disadvantage of a between panel and component location for the heat transfer or conduction means is that it cannot be adapted to use with components of the type wherein the component is designed to rest directly against the panel surface and electrical connections are made at locations around the peripheral, bottom edge of the component.

SUMMARY OF THE INVENTION

With the foregoing in mind, the present invention has as a principle object the provision of an improved construction for removal of heat from components forming part of circuit panels, which construction avoids or overcomes many of the shortcomings and disadvantages of the prior art.

Another important object of this invention is to provide a device for use in combination with circuit boards or panels having a plurality of electronic components and heat conductive means associated therewith in such a manner as to reduce vibration and increase resistance to mechanical shock, while providing effective removal of heat.

Still another object is the provision of apparatus for efficient thermal energy transfer from electronic components on an edge mounted circuit panel to the panel supporting structure.

Yet another object is to accomplish the foregoing while maintaining lightness in weight, low cost, and reliability of operation.

The invention may further be said to reside in certain novel combinations, arrangements, dispositions, and cooperation of elements by which the previously stated objects and advantages are attained, as well as others which will become apparent from the following description of a presently preferred exemplary embodiment when read in conjunction with the accompanying drawings forming part of this specification.

DESCRIPTION OF THE PREFERRED EMBODIMENT

Figure 1:
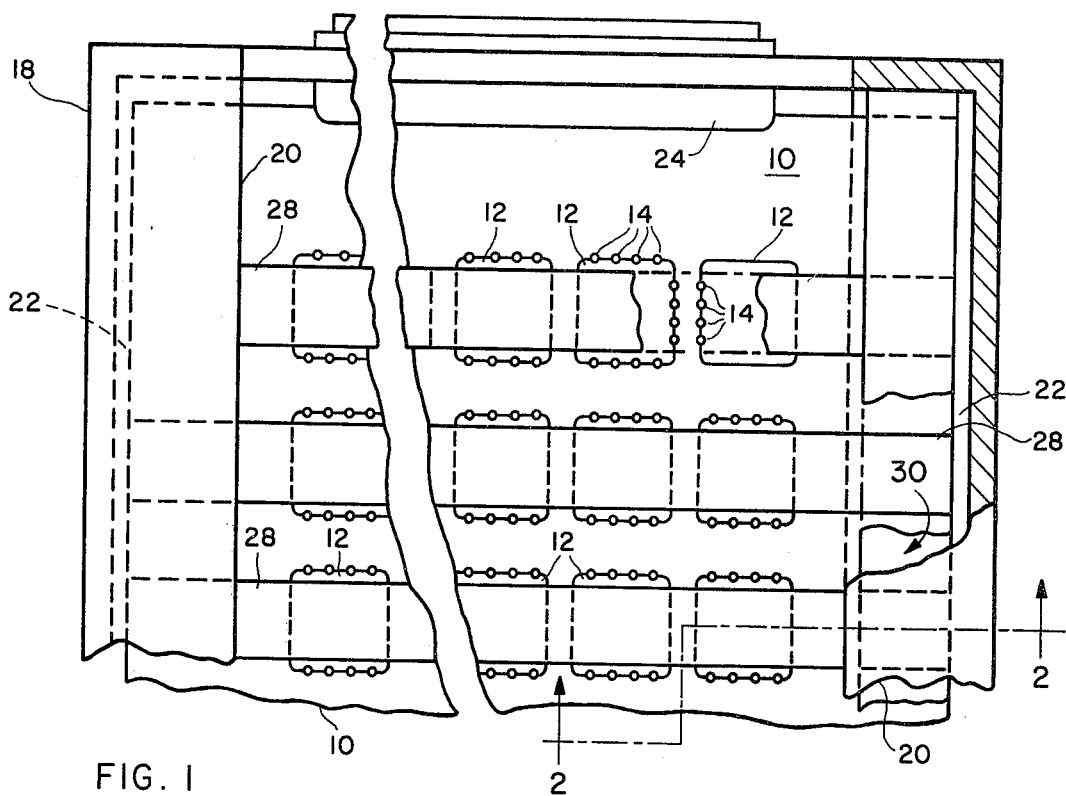
FIG. 1 is a fragmentary plan view of a circuit board or panel in association with a support frame and heat transfer construction embodying the invention.

In the presently preferred form of the invention illustrated in the drawings and described hereinafter, there is provided a circuit panel or board 10 carrying a plurality of electronic circuit components 12 which may include discrete electronic elements but are, in the more usual case, integrated circuit devices. The components 12 are conveniently arranged in rows from side to side across the board 10, and are conveniently, but not necessarily selected to be of uniform height or thickness above the board in any given row. As may best be seen in FIGS. 1 and 2, the components in this exemplary embodiment are rectangular or square in plan and lie directly against the board 10. Each may have a plurality of electrical connections 14 made to conductive areas (not shown) on the board and these connections may be made at a plurality of locations around the lower peripheral edge of the component. At this point it should be noted that terms such as side, top, upper, lower, above, and the like, are used herein for convenience in understanding the description and claims with reference to the drawings, with the understanding that no particular orientation of apparatus embodying the invention is required.

Figure 2:
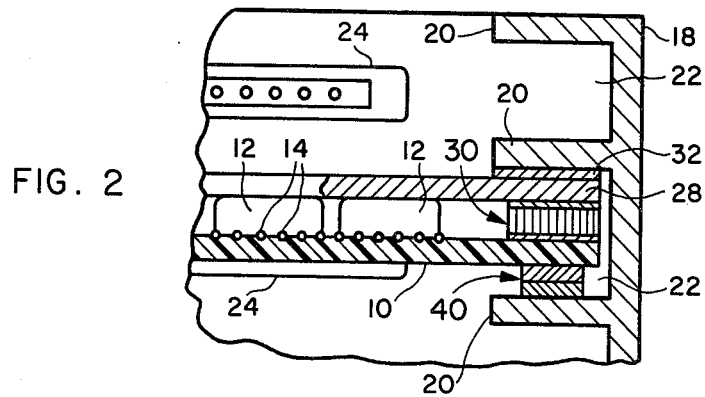
FIG. 2 is a sectional view of the apparatus of FIG. 1 taken substantially along line 2—2 thereof.

The board 10 is carried or supported in a heat receiving and dissipating frame 18 having internal side flanges 20 defining parallel grooves 22 that receive the edge portions of the circuit board 10. As shown in FIG. 2, the frame may have a series of such grooves, one being illustrated in an unoccupied condition.

A plurality of receptacles 24 are mounted in the end of the frame 18 for receiving suitable connector pins of conventional type (not shown) at the edge of each board 10. Other known connection means may, of course, be utilized.

The components 12 of the circuit board 10 are adapted to have heat carried away therefrom and to the frame in an efficient manner through the association therewith of heat conductive means, here shown in the form of bar shaped elements 28. The elements 28, which may comprise metal bars or bar-shaped heat pipes, lie in a plane that is parallel to and spaced above the upper plane surface of the board and engage directly against the top surfaces of the components 12 in each row, so that heat is transmitted from each component to the corresponding element by conduction. A thermally conductive grease or paste may be advantageously used between the upper surface of each component 12 and the overlying element 28 to increase contact area in circumstances where the component surfaces are not smooth or plane enough to assure good contact.

The elements 28 span the width of the board 10 and the end portions of the elements overlie the side edge portions of the boards.

Figure 3:
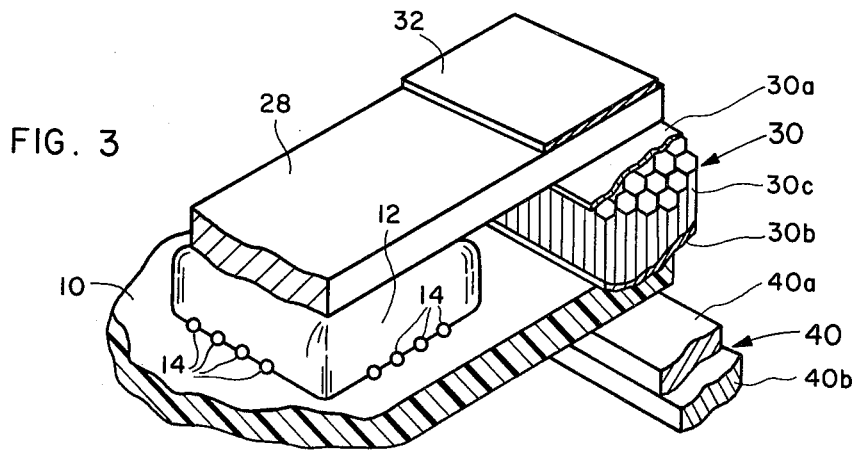
FIG. 3 is an enlarged perspective view illustrating a portion of the apparatus of FIGS. 1 and 2.

Disposed between the end portions of each element 28 and the edge portions of the respective board 10 is a light weight spacer 30. As is best illustrated in FIG. 3, the spacer 30, which may be elongated and span the ends of a plurality of elements 28, comprises an upper skin 30a, a lower skin 30b, and a central filler 30c. In this embodiment the upper and lower skins are formed of a rigid, fiber reinforced synthetic plastic resin material while the filler 30c is configured as a honeycomb formed of plastic resin impregnated paper, aluminum, or the like. The honeycomb configuration provides large resistance to crushing by compressive forces in directions normal to the planes of the board and the element 28.

Disposed between the upper surface of each bar 28 and its corresponding flange 20 is a thin layer or film 32 of a heat transmitting or conductive material that is sufficiently compliant to assure large or substantially complete contact area between the opposing surfaces of the flanges and bars. The film 32 advantageously comprises a finely divided metal or metal oxide filled silicone rubber material.

The board 10, the spacer 30, and the heat conducting bar 28 are tightly clamped together and against a corresponding flange 20 by a clamping device 40 lying between the board and an opposing flange 20. The device 40 may be any of several well known types, but is here shown as comprising first and second elongated members 40a, 40b that constitute long opposing ramps and are movable longitudinally relative to one another to produce a wedging action against the board.

In those circumstances where components 12 in a given row are of differing heights, a bar 28 of varying thickness can be employed, or appropriate, heat conductive spacer elements can be inserted between the shorter components and the bar.

Obviously, other embodiments and modifications of the subject invention will readily come to the mind of one skilled in the art having the benefit of the teachings presented in the foregoing description and the drawing. It is, therefore, to be understood that this invention is not to be limited thereto and that said modifications and embodiments are intended to be included within the scope of the appended claims.

What is claimed is:

1. In the combination of an electronic circuit board and electronic components mounted on said board and having substantially planar upper surfaces facing away from said board and lower surfaces disposed directly against the upper surface of said board, support means for said board, and apparatus for cooling said components by transfer of heat to said support means, the improvement comprising:

thermal conductor means lying in a plane substantially parallel to and spaced above said upper surface of said board, said thermal conductor means comprising an elongated bar-shaped element spanning said board, engaging said upper surfaces of said components and having its end portions overlying the side edge portions of the board;

spacer means disposed between said upper surface of said board and said thermal conductor means, said spacer means comprising an upper skin member, a lower skin member, and a compression resistant filler member disposed between said upper and lower skin members so as to be characterized by a high resistance to compressive forces in directions normal to said upper surface of said board; and clamp means acting through said board and said spacer means to hold said thermal conductor means in heat transfer relation to said support means;

said support means comprising a thermally conductive frame having inwardly directed flanges defining grooves receiving said clamp means, said edge portions of said board, said spacer means, and said end portions of said heat transfer means.

2. The combination as defined in claim 1, and wherein:

said filler member comprises a material of honeycomb configuration.

3. The combination defined in claim 2, and further comprising:

a film of high thermal conductivity material disposed between said end portions of said thermal conductor means and said flanges, said film being compliant under pressure.

4. The combination defined in claim 3, and wherein:

said film comprises a metal based filler of good thermal conductivity in a synthetic plastic carrier.

5. The combination as defined in claim 4, and wherein: said carrier comprises a silicone material.

* * * * *